(12) United States Patent
Sugimoto et al.

(10) Patent No.: US 8,097,350 B2
(45) Date of Patent: Jan. 17, 2012

(54) GLASS CERAMIC COMPOSITION, GLASS CERAMIC SINTERED BODY, AND MULTILAYER CERAMIC ELECTRONIC COMPONENT

(75) Inventors: Yasutaka Sugimoto, Kyoto (JP); Sadaaki Sakamoto, Koka (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 484 days.

(21) Appl. No.: 12/367,283

(22) Filed: Feb. 6, 2009

(65) Prior Publication Data

US 2009/0169839 A1 Jul. 2, 2009

Related U.S. Application Data

(63) Continuation of application No. PCT/JP2007/065359, filed on Aug. 6, 2007.

(30) Foreign Application Priority Data

Aug. 9, 2006 (JP) ................................. 2006-216666

(51) Int. Cl.
*B32B 17/06* (2006.01)

(52) U.S. Cl. ............. 428/701; 428/209; 501/79; 501/32

(58) Field of Classification Search .......................... None
See application file for complete search history.

(56) References Cited

U.S. PATENT DOCUMENTS

| 4,223,369 | A | * | 9/1980 | Burn ........................... 361/321.4 |
| 4,593,006 | A | * | 6/1986 | Takabatake et al. ............ 501/32 |
| 2002/0165080 | A1 | * | 11/2002 | Sengupta et al. ............. 501/137 |

FOREIGN PATENT DOCUMENTS

| JP | 5217426 | 8/1993 |
| JP | 2005-104775 | 4/2005 |
| JP | 2006-181737 | 7/2006 |

OTHER PUBLICATIONS

Translation of JP2005-104775. Retrieved Jul. 29, 2011.*
International Search Report for PCT/JP2007/065359 dated Mar. 9, 2007.

\* cited by examiner

*Primary Examiner* — David Sample
*Assistant Examiner* — Prashant J Khatri
(74) *Attorney, Agent, or Firm* — Dickstein Shapiro LLP (57) ABSTRACT

A glass ceramic composition which is formed by firing into a sintered body having a relatively high relative dielectric constant and Q value is provided. It includes a $CaZrO_3$-based ceramic and a $Li_2O$—$MgO$—$ZnO$—$B_2O_3$—$SiO_2$-based glass. The $Li_2O$—$MgO$—$ZnO$—$B_2O_3$—$SiO_2$-based glass is 1 to 12 percent by weight of the total composition, the content of $Li_2O$ is 3.5 to 15 percent by weight, the content of MgO is 20 to 50 percent by weight, the content of BaO is 0 to 25 percent by weight, the content of CaO is 0 to 10 percent by weight, the content of SrO is 0 to 25 percent by weight, the content of $B_2O_3$ is 16 to 29 percent by weight, the content of $SiO_2$ is 11 to 35 percent by weight, the content of ZnO is 5 to 20 percent by weight, and the content of $Al_2O_3$ is 0 to 15 percent by weight. This glass ceramic composition is advantageously used for green glass ceramic layers to form a green laminate structure useful as a main component body of an LC filter or the like.

17 Claims, 4 Drawing Sheets

GLASS CERAMIC COMPOSITION, GLASS CERAMIC SINTERED BODY, AND MULTILAYER CERAMIC ELECTRONIC COMPONENT

This is a continuation of application Serial No. PCT/JP2007/065359, filed Aug. 6, 2007.

TECHNICAL FIELD

The present invention relates to a glass ceramic composition, a glass ceramic sintered body formed by sintering the glass ceramic composition, and a multilayer ceramic electronic component including glass ceramic layers obtained by sintering the glass ceramic composition, and more particularly, relates to an improvement to increase the Q value of a glass ceramic sintered body.

BACKGROUND ART

As a glass ceramic composition of interest to the present invention, a composition has been disclosed in Japanese Unexamined Patent Application Publication No. 5-217426 (Patent Document 1). Patent Document 1 has disclosed a non-reducing dielectric glass ceramic composition in which $Li_2O$—RO—$B_2O_3$—$SiO_2$-based glass (R indicates at least one of Ba, Ca, and Sr) is added to a (Ca, Sr) (Zr, Ti)$O_3$—MnO—$SiO_2$-based ceramic used as a primary component.

According to this glass ceramic composition, firing can be performed at a temperature of 1,000° C. or less, and as the result of the firing, a glass ceramic sintered body having a high relative dielectric constant, stable dielectric constant temperature properties, and a high Q value can be obtained. Consequently, when the glass ceramic composition disclosed in Patent Document 1 is used, a metal, such as gold, silver, or copper, having a high electrical conductivity can be used for a conductive pattern which is formed inside, and the loss caused by resistance of a conductive material is small in a high frequency region; hence, when the above glass ceramic composition is used for a multilayer ceramic electronic component forming, for example, a resonator, a filter, or a capacitor, superior high frequency properties can be realized.

Although the glass ceramic composition disclosed in Patent Document 1 has superior properties as described above, there is still some room for improvement. In particular, a Qf of approximately 5,000 GHz is the limit as the Q value.

DISCLOSURE OF INVENTION

Problems to be Solved by the Invention

Accordingly, an object of the present invention is to provide a glass ceramic composition which can improve the properties, in particular the Q value, of the glass ceramic composition disclosed in Patent Document 1.

Another object of the present invention is to provide a glass ceramic sintered body formed by sintering the glass ceramic composition described above and a multilayer ceramic electronic component including glass ceramic layers formed by sintering a glass ceramic composition.

Means for Solving the Problems

In order to solve the technical problem described above, a glass ceramic composition of the present invention includes a $CaZrO_3$-based ceramic and a $Li_2O$—MgO—ZnO—$B_2O_3$—$SiO_2$-based glass, and in this glass ceramic composition, the $Li_2O$—MgO—ZnO—$B_2O_3$—$SiO_2$-based glass occupies 1 to 12 percent by weight of the total composition, and in the glass, the content of $Li_2O$ is 3.5 to 15 percent by weight, the content of MgO is 20 to 50 percent by weight, the content of BaO is 0 to 25 percent by weight, the content of CaO is 0 to 10 percent by weight, the content of SrO is 0 to 25 percent by weight, the content of $B_2O_3$ is 16 to 29 percent by weight, the content of $SiO_2$ is 11 to 35 percent by weight, the content of ZnO is 5 to 20 percent by weight, and the content of $Al_2O_3$ is 0 to 15 percent by weight.

In addition, the $CaZrO_3$-based composition is preferably included in the range of 7 to 86 percent by weight of the glass ceramic composition.

The glass ceramic composition of the present invention preferably further includes 1 to 84 percent by weight of a $BaZrO_3$-based ceramic and 0 to 6 percent by weight of $SrTiO_3$. The content of the $BaZrO_3$-based ceramic is more preferably set to 1 to 30 percent by weight.

In addition, the glass ceramic composition of the present invention preferably further includes 40 percent by weight or less of $Mg_2SiO_4$.

The present invention is also directed to a glass ceramic sintered body formed by sintering the above glass ceramic composition.

The present invention is also directed to a multilayer ceramic electronic component having first glass ceramic layers formed by firing the above glass ceramic composition.

When the multilayer ceramic electronic component of the present invention further includes second glass ceramic layers laminated together with the first glass ceramic layers, the second ceramic layers are preferably obtained by firing a second glass ceramic composition having the following composition.

That is, the second glass composition includes (1) a first ceramic powder primarily composed of forsterite; (2) a second ceramic powder composed of at least one selected from the group consisting of a ceramic powder primarily composed of calcium titanate, a ceramic powder primarily composed of strontium titanate, and a ceramic powder primarily composed of titanium oxide; and (3) a borosilicate glass powder which includes 3 to 15 percent by weight of lithium in the form of $Li_2O$, 20 to 50 percent by weight of magnesium in the form of MgO, 15 to 30 percent by weight of boron in the form of $B_2O_3$, to 45 percent by weight of silicon in the form of $SiO_2$, 6 to 20 percent by weight of zinc in the form of ZnO, and 0 to 15 percent by weight of aluminum in the form of $Al_2O_3$.

In the second glass ceramic composition described above, the borosilicate glass powder occupies 3 percent by weight or more of the second glass ceramic composition.

In addition, at least one additive component selected from the group consisting of calcium oxide, barium oxide, and strontium oxide is added to the borosilicate glass powder.

When the content of the additive component is represented by the ratio occupied in the borosilicate glass powder, the lower limit of the content of the additive component is 2 percent by weight in total when calcium oxide, barium oxide, and strontium oxide are measured in the form of CaO, BaO, and SrO, respectively, and the upper limit of the content of the additive component is 15 percent by weight in the case of calcium oxide in the form of CaO, 25 percent by weight in the case of barium oxide in the form of BaO, and 25 percent by weight in the case of strontium oxide in the form of SrO.

In the multilayer ceramic electronic component of the present invention, a conductive pattern which is primarily composed of gold, silver, or copper, and which is simultaneously fired with the glass ceramic composition is preferably further provided on and/or inside a surface.

Advantages

According to the glass ceramic composition of the present invention, since a $Li_2O$—MgO—ZnO—$B_2O_3$—$SiO_2$-based glass having a specific composition ratio has significantly superior wettability to a $CaZrO_3$-based ceramic, even if a small amount is added as compared to that of the $Li_2O$—RO—$B_2O_3$—$SiO_2$-based glass disclosed in Patent Document 1, its low-temperature sintering properties can be sufficiently obtained while the properties of the $CaZrO_3$-based ceramic are maintained. Hence, according to a glass ceramic sintered body obtained by firing this glass ceramic composition, the high relative dielectric constant of a $CaZrO_3$-based ceramic can be maintained.

In addition, the glass ceramic composition of the present invention precipitates a crystalline phase, such as $Mg_3B_2O_6$ and/or $Li_2MgSi_2O_8$. Since these crystalline phases show a high Q value, a high Q value can be obtained in the glass ceramic sintered body of the present invention.

Hence, according to a multilayer ceramic electronic component having glass ceramic layers formed by firing the glass ceramic composition of the present invention, superior high-frequency properties can be realized.

Since the glass ceramic composition of the present invention can be sintered at a low temperature of 1,000° C. or less, a conductive pattern which is primarily composed of gold, silver, or copper, and which is simultaneously fired with this glass ceramic composition, can be provided on a surface of a multilayer ceramic electronic component and/or in inside thereof. In addition, since the conductive pattern primarily composed of gold, silver, or copper is formed, the loss caused by the resistance of the conductive pattern can be reduced.

When the glass ceramic composition of the present invention further includes 1 to 84 percent by weight of a $BaZrO_3$-based ceramic, and 0 to 6 percent by weight of $SrTiO_3$, the rate of change in capacitance before and after a loading test performed on a glass ceramic composition obtained by firing this glass ceramic composition can be decreased.

In addition, the $BaZrO_3$-based ceramic functions to increase the temperature coefficient of dielectric constant to the positive side, and on the other hand, $SrTiO_3$ functions to increase the temperature coefficient of dielectric constant to the negative side. Hence, when a $BaZrO_3$-based ceramic is allowed to be present with $SrTiO_3$, it can function to adjust the temperature coefficient of dielectric constant.

When the content of the $BaZrO_3$-based ceramic described above is controlled in the range of 1 to 30 percent by weight, the rate of change in capacitance can be further decreased.

When the glass ceramic composition of the present invention further includes 40 percent by weight or less of $Mg_2SiO_4$, the Q value can be further improved.

When the multilayer ceramic electronic component of the present invention further includes the above-described second glass ceramic layers laminated together with the first glass ceramic layers formed by firing the glass ceramic composition of the present invention, the second glass ceramic layers have not only superior chemical stability, a relatively low relative dielectric constant, a high Q value, and a stable temperature coefficient ($\tau_1$) of a resonant frequency but also have superior affinity to the first glass ceramic layers. Hence, a multilayer ceramic electronic component having a high reliability can be obtained.

In the second glass ceramic composition formed into the second glass ceramic layer, 55 percent by weight or more of the first ceramic powder, 6 to 30 percent by weight of the second ceramic powder, and 3 to 20 percent by weight of the borosilicate glass powder are preferably included. In this second glass ceramic composition, even if the content of the borosilicate glass powder is low, such as 20 percent by weight or less, the superior properties described above can be obtained. Hence, according to the second glass ceramic composition, a multilayer ceramic electronic component can be obtained which is advantageous in terms of cost, which can easily control reaction between the second ceramic powder and glass, which can easily control a resonant-frequency temperature coefficient ($\tau_1$) by an additive, and which has superior plating resistance.

REFERENCE NUMERALS

1 LC filter
3 main component body
8, 57 green laminate structure
10 to 20, 59 green glass ceramic layer
21, 24, 38, 40 coil pattern
22, 28, 29, 34, 35, 41 extension pattern
23, 25, 26, 30, 32, 36, 37, 39, 56, 65 via hole conductor
27, 31, 33 capacitor pattern
53, 62, 63 glass ceramic layer
54, 66 external conductive film
55, 64 internal conductive film
51, 61 multilayer ceramic substrate
67 green composite laminate structure

BEST MODE FOR CARRYING OUT THE INVENTION

Figure 1:
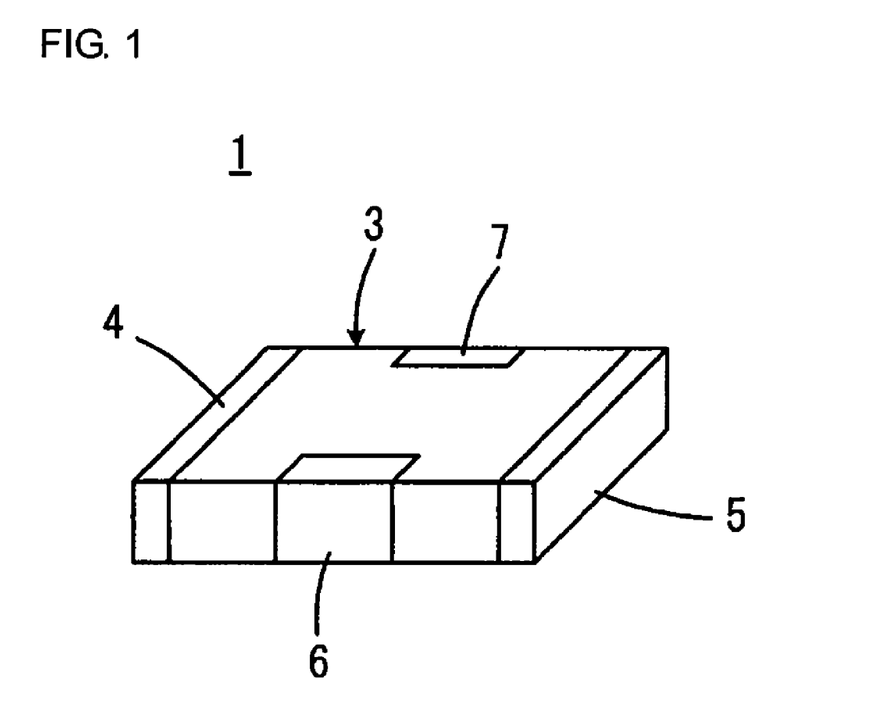
FIG. 1 is a perspective view showing the appearance of an LC filter 1 as one example of a multilayer ceramic electronic component formed using a glass ceramic composition of the present invention.
Figure 2:
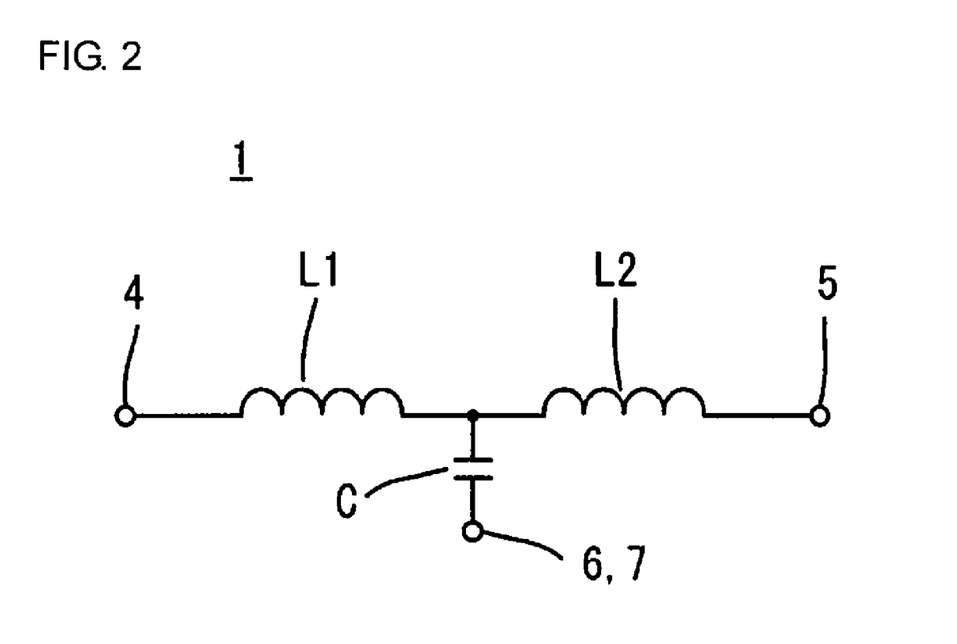
FIG. 2 is an equivalent circuit diagram of the LC filter 1 shown in FIG. 1.
Figure 3:
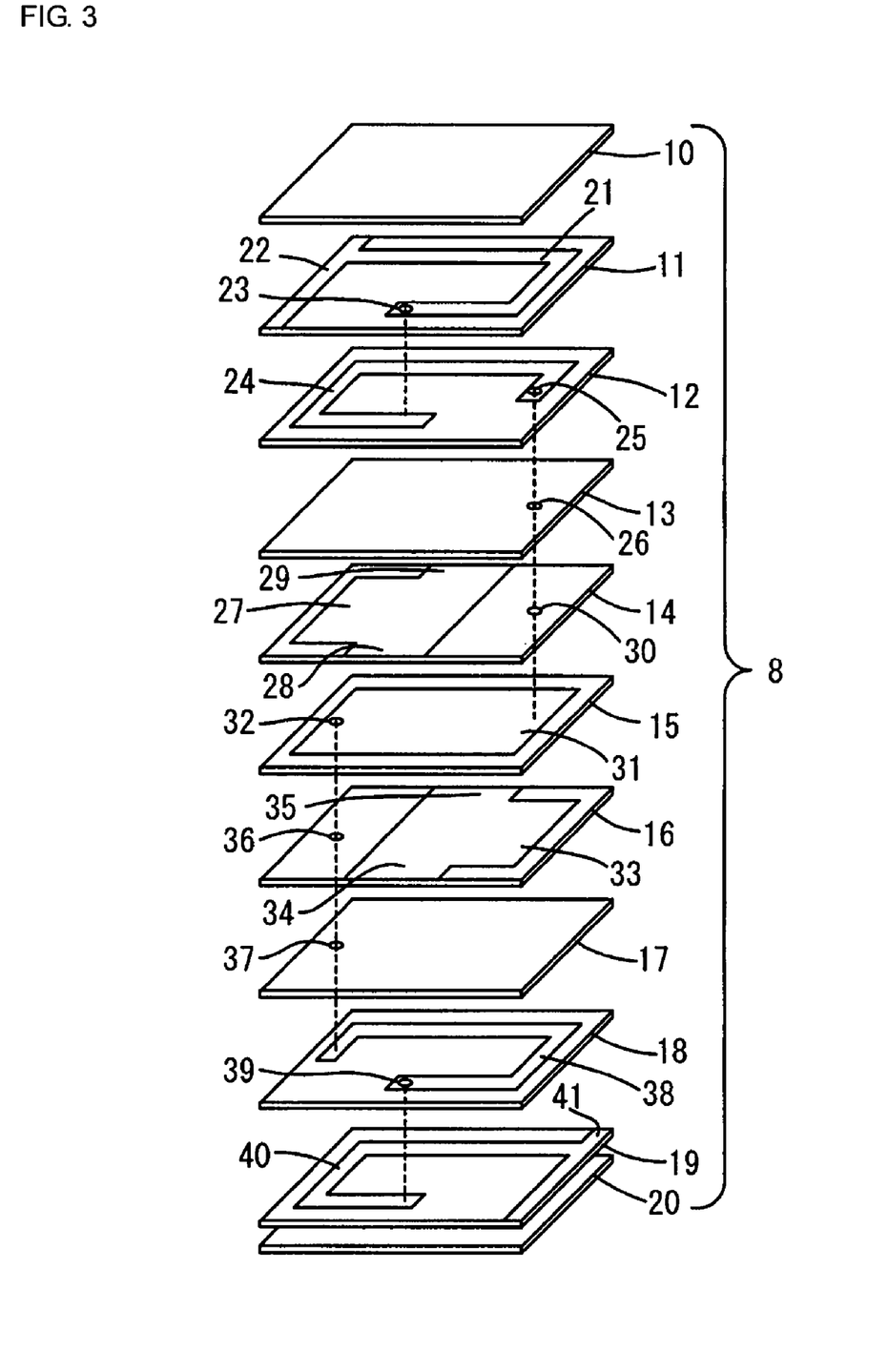
FIG. 3 is a perspective view showing an exploded green laminate structure 8 functioning as an intermediate product to be processed in a firing step in order to form the LC filter 1 shown in FIG. 1.

FIGS. 1 to 3 are views illustrating an LC filter as one example of a multilayer ceramic electronic component formed of a glass ceramic composition of the present invention. FIG. 1 is a perspective view showing the appearance of an LC filter 1, FIG. 2 is an equivalent circuit diagram of the LC filter 1, and FIG. 3 is a perspective view showing an exploded green laminate structure 8 functioning as an intermediate product to be processed in a firing step in order to form the LC filter 1.

As shown in FIG. 1, the LC filter 1 includes a main component body 3 functioning as a laminate structure formed of glass ceramic layers laminated to each other, and on external surfaces of this main component body 3, terminal electrodes 4 and 5 are provided at individual end portions and terminal electrodes 6 and 7 are provided at intermediate portions of individual side surfaces.

As shown in FIG. 2, the LC filter 1 has series-connected two inductance elements L1 and L2 between the terminal electrodes 4 and 5 and a capacitance element C between a portion connecting the inductance elements L1 and L2 and the terminal electrodes 6 and 7.

As shown in FIG. 3, the green multilayer structure 8 to be formed into the main component body 3 has green glass ceramic layers 10 to 20 laminated to each other. However, the number of the green glass ceramic layers is not limited to that shown in the figure.

The green glass ceramic layers 10 to 20 are each composed of a green sheet formed by a doctor blade method or the like using a slurry including the glass ceramic composition of the present invention which has the composition as described below.

In addition, in order to form the inductance elements L1 and L2 and the capacitance element C as shown in FIG. 2, conductive patterns are provided as described below on specific layers among the green glass ceramic layers 10 to 20.

On the green glass ceramic layer 11, a coil pattern 21 forming a part of the inductance element L1 is formed, and an extension pattern 22 extended from one end of this coil pattern 21 is formed. In addition, a via hole conductor 23 is provided at the other end of the coil pattern 21.

A coil pattern 24 forming a part of the inductance element L1 is formed on the green glass ceramic layer 12, and a via hole conductor 25 is provided at one end of the coil pattern 24. The other end of the coil pattern 24 is to be connected to the above-described via hole conductor 23.

In the green glass ceramic layer 13, a via hole conductor 26 to be connected to the above-described via hole conductor 25 is provided.

On the green glass ceramic layer 14, a capacitor pattern 27 forming a part of the capacitance element C is formed, and extension patterns 28 and 29 extended from the capacitor pattern 27 are formed. In addition, in this glass ceramic layer 14, a via hole conductor 30 to be connected to the above-described via hole conductor 26 is provided.

A capacitor pattern 31 forming a part of the capacitance element C is formed on the green glass ceramic layer 15, and a via hole conductor 32 to be connected to the capacitor pattern 31 is provided. The capacitor pattern 31 is to be connected to the above-described via hole conductor 30.

On the green glass ceramic layer 16, a capacitor pattern 33 forming a part of the capacitance element C is formed, and extension patterns 34 and 35 extended from this capacitor pattern 33 are formed. In addition, in this glass ceramic layer 16, a via hole conductor 36 to be connected to the above-described via hole conductor 32 is provided.

In the green glass ceramic layer 17, a via hole conductor 37 to be connected to the above-described via hole conductor 36 is provided.

A coil pattern 38 forming a part of the inductance element L2 is formed on the green glass ceramic layer 18, and a via hole conductor 39 is provided at one end of the coil pattern 38. The other end of the coil pattern 38 is to be connected to the above-described via hole conductor 37.

On the green glass ceramic layer 19, a coil pattern 40 forming a part of the inductance element L2 is formed, and an extension pattern 41 extended from one end of the coil pattern 40 is formed. The other end of the coil pattern 40 is to be connected to the above-described via hole conductor 39.

When the coil patterns 21, 24, 38, and 40, the extension patterns 22, 28, 29, 34, 35, and 41, the via hole conductors 23, 25, 26, 30, 32, 36, 37, 39, and the capacitor patterns 27, 31, and 33 described above are formed, a conductive paste including, as a conductive component, a metal powder primarily composed of gold, silver, or copper is preferably used.

In addition, in order to form the coil patterns 21, 24, 38, and 40, the extension patterns 22, 28, 29, 34, 35, and 41, and the capacitor patterns 27, 31, and 33, a printing method, such as screen printing, is used.

In addition, when the via hole conductors 23, 25, 26, 30, 36, 37, and 39 are provided, penetrating holes are formed in green sheets to be formed into the respective green glass ceramic layers 11 to 18 by punching or the like, and a conductive paste is filled in the penetrating holes.

In order to form the green laminate structure 8, ceramic green sheets to be formed into the green glass ceramic layers 10 to 20 are laminated to each other and are then pressed in the lamination direction.

The green laminate structure 8 is then fired. As described above, the main component body 3 is formed by sintering the green laminate structure 8.

When the green laminate structure 8 is fired, a method may be used in which after a shrinkage restriction layer including a powdered inorganic material, such as alumina, zirconia, mullite, spinel, or magnesia, which is not sintered at the sintering temperature of a ceramic material included in the green glass ceramic layers 10 to 20 is formed on at least one primary surface of the green laminate structure 8, a firing step is performed in the state as described above, and after this firing step, the shrinkage restriction layer is removed. With the method described above, since the shrinkage of the glass ceramic layers 10 to 20 in the primary surface direction can be suppressed in the firing step, the dimensional accuracy of the obtained main component body 3 can be improved.

Next, the terminal electrodes 4 to 7 are formed on the exterior surfaces of the main component body 3, for example, by applying a conductive paste, followed by a firing step. The terminal electrodes 4 to 7 may be processed by a plating process whenever necessary.

The terminal electrode 4 described above is electrically connected to the extension pattern 22 shown in FIG. 3. The terminal electrode 5 is electrically connected to the extension pattern 41. The terminal electrode 6 is electrically connected to the extension patterns 28 and 34. The terminal electrode 7 is electrically connected to the extension patterns 29 and 35.

Figure 4:
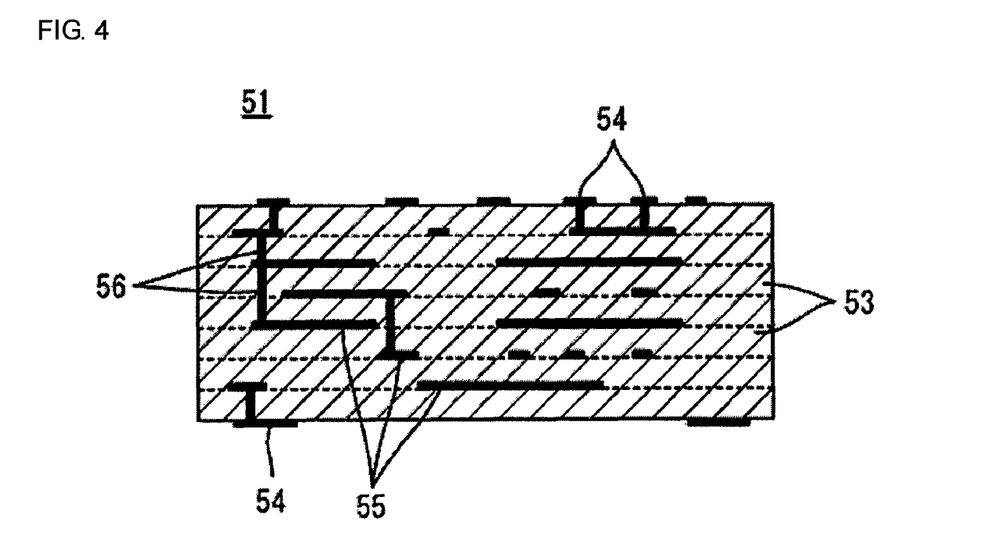
FIG. 4 is a schematic cross-sectional view illustrating a multilayer ceramic substrate 51 as another example of the multilayer ceramic electronic component formed using the glass ceramic composition of the present invention.
Figure 5:
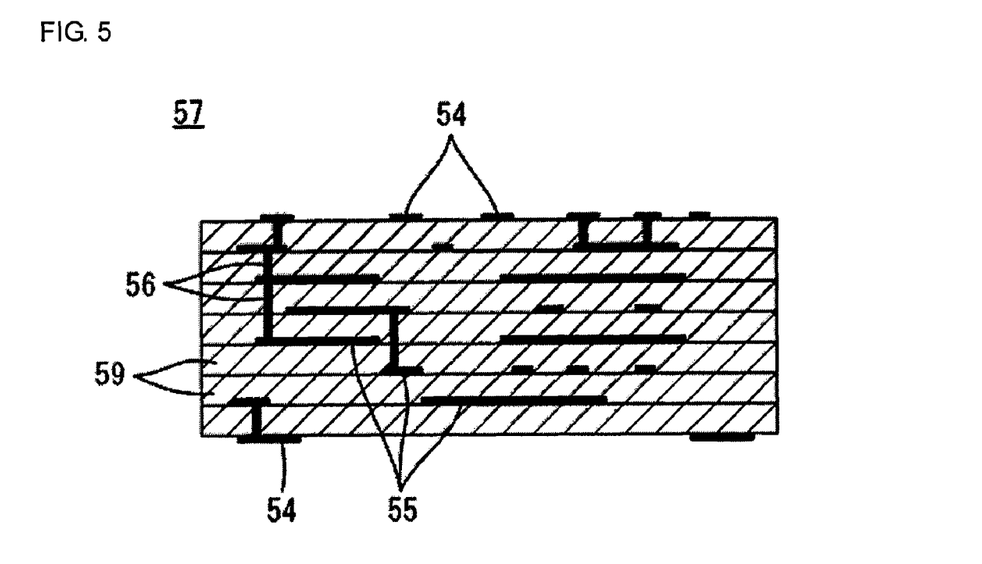
FIG. 5 is a schematic cross-sectional view illustrating a green laminate structure 57 functioning as an intermediate product to be processed in a firing step in order to form the multilayer ceramic substrate 51 shown in FIG. 4.

FIGS. 4 and 5 are views illustrating a multilayer ceramic substrate as another example of a multilayer ceramic electronic component formed using the glass ceramic composition of the present invention. FIG. 4 is a schematic cross-sectional view showing a multilayer ceramic substrate 51, and FIG. 5 is a schematic cross-sectional view showing a green laminate structure 57 functioning as an intermediate product to be processed in a firing step in order to form the multilayer ceramic substrate 51 shown in FIG. 4.

As shown in FIG. 4, the multilayer ceramic substrate 51 has glass ceramic layers 53, and various conductive patterns are provided on specific glass ceramic layers 53.

As the conductive patterns described above, there are several external conductive films 54 formed on end surfaces of the multilayer ceramic substrate 51 in the lamination direction, several internal conductive films 55 formed along interfaces between the glass ceramic layers 53, and several via hole conductors 56 formed to penetrate the glass ceramic layers 53.

The external conductive films 54 are used to be connected to an electronic component (not shown) to be mounted on the external surface of the multilayer ceramic substrate 51 or to be connected to a circuit board (not shown) on which this multilayer ceramic substrate 51 is mounted.

The internal conductive films 55 and the via hole conductors 56 form passive elements, such as a capacitor and an inductor, or function so as to connect therebetween.

The multilayer ceramic substrate 51 shown in FIG. 4 is obtained by firing the green laminate structure 57 shown in FIG. 5.

The green laminate structure 57 has green glass ceramic layers 59 which are laminated to each other and which are formed into the glass ceramic layers 53 described above and also has the above-described external conductive films 54, internal conductive films 55, and via hole conductors 56.

The green glass ceramic layers 59 are each composed of a green sheet formed by a doctor blade method or the like using a slurry including the glass ceramic composition of the present invention which has the composition as described below.

Methods for forming the external conductive films 54, the internal conductive films 55, and the via hole conductors 56 are substantially equivalent to the methods for forming the coil pattern 21 and the like and the via hole conductor 23 and the like described above with reference to FIG. 3.

After the green laminate structure 57 is formed, firing is performed in a manner substantially equivalent to that for the LC filter 1 described above with reference to FIGS. 1 to 3, so that the targeted multilayer ceramic substrate 51 can be obtained.

In addition, when the green laminate structure 57 is fired, the shrinkage restriction layer described above may also be provided.

When the LC filter 1 or the multilayer ceramic substrate 51, which are described above, is manufactured, the glass ceramic composition of the present invention is used as a glass ceramic composition included in the green glass ceramic layers 10 to 20 or 59. That is, a glass ceramic composition is used which includes a $CaZrO_3$-based ceramic and a $Li_2O$—$MgO$—$ZnO$—$B_2O_3$—$SiO_2$-based glass, the $Li_2O$—$MgO$—$ZnO$—$B_2O_3$—$SiO_2$-based glass occupies 1 to 12 percent by weight of the total composition, the content of $Li_2O$ is 3.5 to 15 percent by weight, the content of MgO is 20 to 50 percent by weight, the content of BaO is 0 to 25 percent by weight, the content of CaO is 0 to 10 percent by weight, the content of SrO is 0 to 25 percent by weight, the content of $B_2O_3$ is 16 to 29 percent by weight, the content of $SiO_2$ is 11 to 35 percent by weight, the content of ZnO is 5 to 20 percent by weight, and the content of $Al_2O_3$ is 0 to 15 percent by weight.

Although a ceramic in which the ratio of Ca to Zr is 1:1 (stoichiometric ratio) is primarily used as the $CaZrO_3$-based ceramic, for example, $CaZr_xO_{1+2x}$ (where x=0.95 to 1.05) may also be used. In addition, a ceramic in which Ca or Zr is partly replaced with another element may also be used. For example, Ca may be partly replaced with Ba and/or Sr, or Zr may be partly replaced with Ti.

In the glass ceramic composition, 7 to 86 percent by weight of the above $CaZrO_3$-based ceramic is preferably included.

The glass ceramic composition of the present invention preferably further includes 1 to 84 percent by weight of a $BaZrO_3$-based ceramic, and 0 to 6 percent by weight of $SrTiO_3$. The content of the above $BaZrO_3$-based ceramic is more preferably set to 1 to 30 percent by weight.

In addition, the glass ceramic composition of the present invention preferably further includes 40 percent by weight or less of $Mg_2SiO_4$.

By using the glass ceramic composition as described above for the green glass ceramic layers 10 to 20 or 59, even if a material primarily composed of gold, silver, or copper, which has a relatively low specific resistance, is used as a conductive component included in the conductive patterns 21 to 41 or 54 to 56 when the green laminate structure 8 or 57 is fired, the glass ceramic layers 10 to 20 or 59 can be sintered by performing firing at a temperature lower than the melting point of the metal mentioned above.

In addition, a glass ceramic sintered body portion of the main component body 3 or a glass ceramic sintered body portion, such as the glass ceramic layer 53 of the multilayer ceramic substrate 51, which is obtained by sintering the green glass ceramic layers 10 to 20 or 59, respectively, can be formed to have, in a high frequency band, a high dielectric constant, superior temperature stability, a high Q value, and superior insulation reliability.

Figure 6:
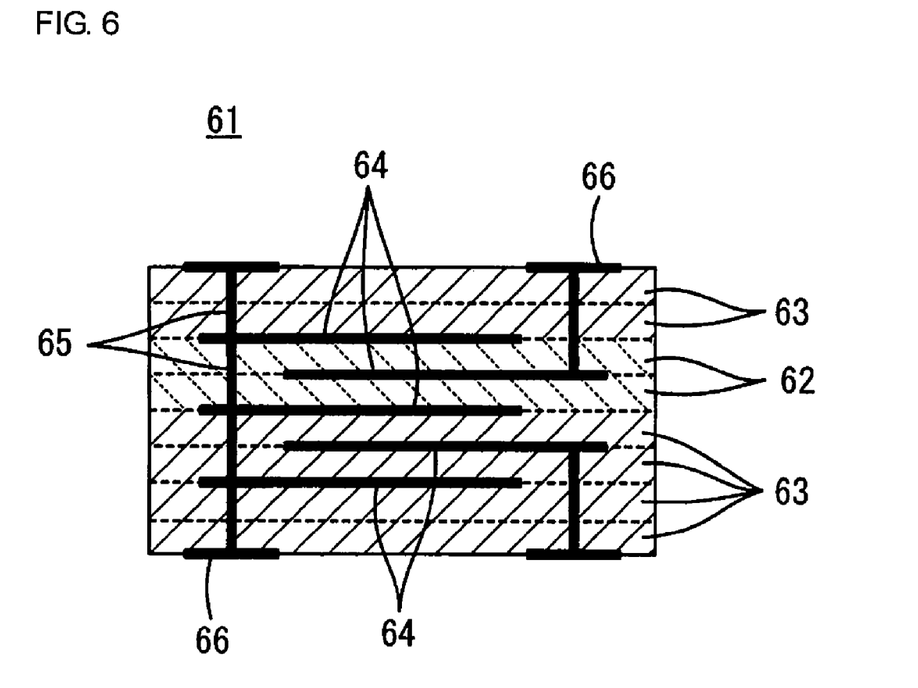
FIG. 6 is a schematic cross-sectional view illustrating a multilayer ceramic substrate 61 as still another example of the multilayer ceramic electronic component formed using the glass ceramic composition of the present invention.
Figure 7:
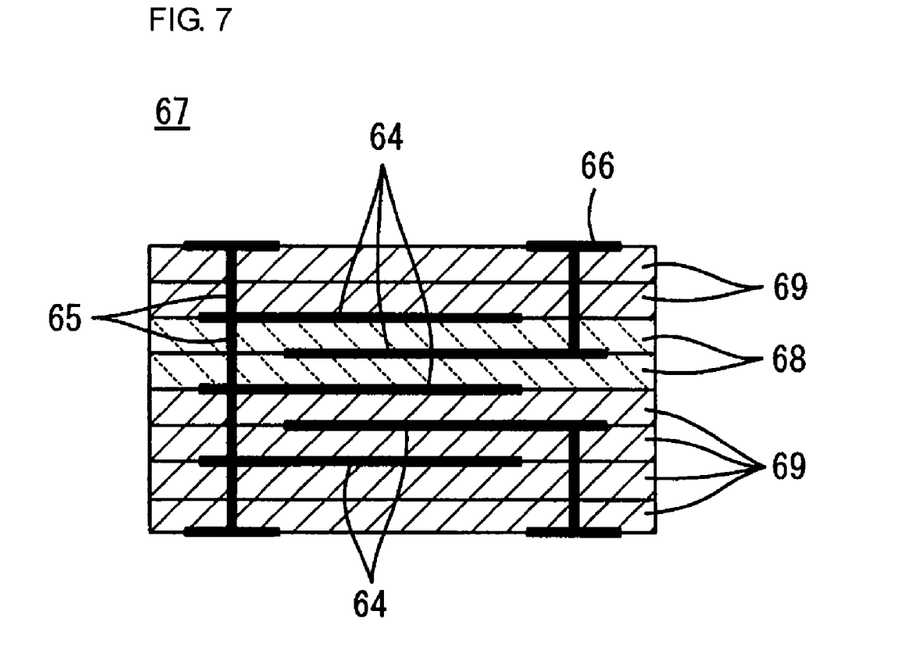
FIG. 7 is a schematic cross-sectional view illustrating a green composite laminate structure 67 functioning as an intermediate product to be processed in a firing step in order to form the multilayer ceramic substrate 61 shown in FIG. 6.

FIGS. 6 and 7 are views illustrating a multilayer ceramic substrate as still another example of the multilayer ceramic electronic component formed using the glass ceramic composition of the present invention. FIG. 6 is a schematic cross-sectional view showing a multilayer ceramic substrate 61, and FIG. 7 is a schematic cross-sectional view showing a green composite laminate structure 67 functioning as an intermediate product to be processed in a firing step in order to form the multilayer ceramic substrate 61 shown in FIG. 6.

The multilayer ceramic substrate 61 has a plurality of first glass ceramic layers 62 laminated to each other and a plurality of second glass ceramic layers 63 laminated to each other, and the second glass ceramic layers 63 are disposed so as to sandwich the first glass ceramic layers 62.

The first glass ceramic layers 62 are each composed of a glass ceramic sintered body obtained by firing the glass ceramic composition of the present invention and have a relatively high relative dielectric constant, such as 15 or more.

In addition, the second glass ceramic layers 63 are each composed of a glass ceramic sintered body obtained by firing a second glass ceramic composition as described below and have a relatively low relative dielectric constant, such as 10 or less.

The above second glass ceramic composition includes (1) a first ceramic powder primarily composed of forsterite; (2) a second ceramic powder composed of at least one selected from the group consisting of a ceramic powder primarily composed of calcium titanate, a ceramic powder primarily composed of strontium titanate, and a ceramic powder primarily composed of titanium oxide; and (3) a borosilicate glass powder which includes 3 to 15 percent by weight of lithium in the form of $Li_2O$, 20 to 50 percent by weight of magnesium in the form of MgO, 15 to 30 percent by weight of boron in the form of $B_2O_3$, 10 to 45 percent by weight of silicon in the form of $SiO_2$, 6 to 20 percent by weight of zinc in the form of ZnO, and 0 to 15 percent by weight of aluminum in the form of $Al_2O_3$.

In the second glass ceramic composition, the above borosilicate glass powder occupies 3 percent by weight or more of the second glass ceramic composition. At least one additive component selected from the group consisting of calcium oxide, barium oxide, and strontium oxide is added to the borosilicate glass powder. When the content of the additive component is represented by the ratio occupied in the borosilicate glass powder, the lower limit of the content of the additive component is 2 percent by weight in total when calcium oxide, barium oxide, and strontium oxide are in the form of CaO, BaO, and SrO, respectively, and the upper limit of the content of the additive component is 15 percent by weight in the case of calcium oxide in the form of CaO, 25 percent by weight in the case of barium oxide in the form of BaO, and 25 percent by weight in the case of strontium oxide in the form of SrO.

The multilayer ceramic substrate 61 has various conductive patterns. As the conductive patterns, typically, there are internal conductive films 64 provided along specific interfaces between the glass ceramic layers 62, between the glass ceramic layers 63, and between the glass ceramic layers 62 and 63, via hole conductors 65 extended to penetrate specific glass ceramic layers 62 and 63, and external conductive films 66 formed on external surfaces of the multilayer ceramic substrate 61.

Among the above-described internal conductive films 64, several films provided for the first glass ceramic layers 62 having a relatively high dielectric constant are disposed to obtain electrostatic capacitance, so that a capacitance element is formed. The external conductive films 66 are used to be connected to an electronic component (not shown) to be mounted on the external surface of the multilayer ceramic substrate 61 or to be connected to a circuit board (not shown) on which this multilayer ceramic substrate 61 is mounted.

The multilayer ceramic substrate 61 shown in FIG. 6 is obtained by firing the green composite laminate structure 67 shown in FIG. 7.

The green composite laminate structure 67 includes first and second green glass ceramic layers 68 and 69 to be formed into the above-described first and second glass ceramic layers 62 and 63, respectively, and also includes the above-described external conductive films 66, internal conductive films 64, and via hole conductors 65.

The first green glass ceramic layers 68 are each composed of a green sheet formed using a slurry including the glass ceramic composition of the present invention, for example, by a doctor blade method. In addition, the second green glass ceramic layers 69 are each composed of a green sheet formed using a slurry including the second glass ceramic composition, for example, by a doctor blade method.

Methods for forming the external conductive films 66, the internal conductive films 64, and the via hole conductors 65 are substantially equivalent to the methods for forming the coil pattern 21 and the like and the via hole conductor 23 and the like shown in FIG. 3.

After the green composite laminate structure 67 is obtained, firing is performed in a manner substantially equivalent to that for the LC filter 1 described with reference to FIGS. 1 to 3, so that the targeted multilayer ceramic substrate 61 can be obtained.

In addition, when the green composite laminate structure 67 is fired, the above-described shrinkage restriction layer may also be provided.

Next, examples performed to confirm the effects of the present invention will be described.

EXPERIMENTAL EXAMPLE 1

First, in order to obtain the composition ratios of $Li_2O$, $MgO$, $BaO$, $CaO$, $SrO$, $B_2O_3$, $SiO_2$, $ZnO$, and $Al_2O_3$ shown in Table 1, after carbonate or oxide powders thereof were weighed and then sufficiently mixed together, the mixture thus obtained was melted at a temperature of 1,100 to 1,400° C. and was charged into water for rapid cooling, followed by wet pulverization, so that glass powders G1 to G30 were obtained.

not be made transparent since it was not amorphous and was partly crystallized.

Next, after a $CaZrO_3$ powder and one of the Glass powders G1 to 7, 10 to 12, and 14 to 30, which were not devitrified, shown in Table 1 were mixed together to have the composition ratio shown in Table 2, the mixed powder thus obtained was wet-mixed with appropriate amounts of vinyl acetate and purified water, followed by pelletizing, so that powders of Samples 1 to 32 were obtained.

Subsequently, a pressure of 2 ton/cm$^2$ was applied to each powder thus obtained with a dry press machine, so that a disc-shaped molded body having a diameter of 20 mm and a thickness of 1 mm was obtained.

Next, after the molded body was held in the air at a temperature of 400° C. for 2 hours to remove vinyl acetate binder, firing was performed in a reducing atmosphere (nitrogen atmosphere) at a temperature of 980° C. for 2 hours, so that sintered bodies of Samples 1 to 32 were formed.

Next, the relative dielectric constant $\epsilon_r$, Q value, temperature coefficient of dielectric constant (TCC), and insulation reliability of each sintered body were evaluated, and the results are shown in Table 2.

The relative dielectric constant ($\epsilon_r$), Q value, temperature coefficient of dielectric constant (TCC) were measured at a temperature of 20° C., 1 MHz, and 1 Vrms, and the Q value was converted into Qf at 1 GHz.

TABLE 1

| GLASS MARK | $Li_2O$ (PERCENT BY WEIGHT) | $MgO$ (PERCENT BY WEIGHT) | $BaO$ (PERCENT BY WEIGHT) | $CaO$ (PERCENT BY WEIGHT) | $SrO$ (PERCENT BY WEIGHT) | $B_2O_3$ (PERCENT BY WEIGHT) | $SiO_2$ (PERCENT BY WEIGHT) | $ZnO$ (PERCENT BY WEIGHT) | $Al_2O_3$ (PERCENT BY WEIGHT) | REMARKS |
|---|---|---|---|---|---|---|---|---|---|---|
| G1* | 2 | 33 | 3 | — | 2 | 25 | 27 | 8 | — | |
| G2 | 3.5 | 33 | 2 | 1 | 2 | 25 | 25.5 | 8 | — | |
| G3 | 15 | 23 | 2 | — | 7 | 20 | 23 | 10 | — | |
| G4* | 16.5 | 25 | 7 | — | — | 20 | 21.5 | 10 | — | |
| G5* | 6 | 18 | 5 | — | 5 | 26 | 28 | 8 | 4 | |
| G6 | 6 | 20 | 2 | 2 | 3 | 26 | 29 | 8 | 4 | |
| G7 | 5 | 50 | 4 | — | — | 19 | 16 | 6 | — | |
| G8* | 5 | 52 | 4 | — | — | 18 | 15 | 6 | — | DEVITRIFICATION |
| G9* | 8 | 34 | 3 | 1 | 6 | 14 | 25 | 7 | 2 | DEVITRIFICATION |
| G10 | 8 | 34 | 3 | 2 | 3 | 16 | 25 | 7 | 2 | |
| G11 | 6 | 24 | 3 | 1 | 6 | 29 | 21 | 10 | — | |
| G12* | 6 | 23 | 3 | 1 | 6 | 31 | 20 | 10 | — | |
| G13* | 10 | 33 | 3 | 2 | 5 | 23 | 9 | 10 | 5 | DEVITRIFICATION |
| G14 | 10 | 38 | 3 | — | — | 23 | 11 | 10 | 5 | |
| G15 | 5 | 25 | 5 | — | 7 | 18 | 35 | 5 | — | |
| G16* | 6 | 33 | 4 | — | — | 15 | 36 | 6 | — | |
| G17* | 6 | 25 | 3 | — | 3 | 28 | 31 | 4 | — | |
| G18 | 6 | 25 | 3 | — | 5 | 24 | 31 | 6 | — | |
| G19 | 6 | 29 | 2 | 5 | 1 | 19 | 18 | 20 | — | |
| G20* | 6 | 30 | 5 | — | — | 19 | 18 | 22 | — | |
| G21* | 6 | 30 | — | — | 5 | 20 | 15 | 8 | 16 | |
| G22 | 6 | 27 | 3 | 1 | 4 | 20 | 16.5 | 8 | 14.5 | |
| G23* | 5 | 25 | 27 | — | — | 17 | 19 | 7 | — | |
| G24 | 5 | 23 | 25 | — | — | 18 | 23 | 6 | — | |
| G25 | 4 | 33 | 16 | — | — | 17 | 23 | 7 | — | |
| G26* | 6 | 28 | 1 | — | 16 | 18 | 24 | 7 | — | |
| G27 | 6 | 35 | 1 | — | 10 | 19 | 23 | 6 | — | |
| G28* | 6 | 22 | 1 | — | 27 | 16 | 22 | 6 | — | |
| G29 | 6 | 22 | 1 | — | 25 | 18 | 20 | 8 | — | |
| G30 | 6 | 32 | 1 | — | 12 | 19 | 23 | 7 | — | |

In Table 1, Glass Marks provided with * are out of the range of the present invention. "Devitrification" shown in "Remarks" of Table 1 indicates that the composition could not be formed into a glass (could not be vitrified). More particularly, it means the case in which the composition could For evaluation of the insulation reliability, a multilayer capacitor sample was formed in such a way that after a binder and an organic solvent were added to a glass ceramic composition of each sample to form a slurry, the slurry was formed into sheets by a doctor blade method, and steps including conductive-paste printing for forming internal electrodes, lamination, pressure-bonding, and firing were then performed on the sheets. Next, an acceleration test was performed on each multilayer capacitor at a temperature of 85° C. and a relative humidity of 85% with a DC voltage application of 10 V. After this acceleration test was performed for 100 hours, the insulation resistance was measured. When the insulation resistance was $10^{10}\,\Omega$ or more, the sample was regarded to have superior insulation reliability and was represented by "○" in Table 2, and when the insulation resistance was seriously degraded, the sample was regarded to have insufficient insulation reliability and was represented by "x".

Sample 4 had inferior insulation reliability. Sample 4 included Glass G4, and as shown in Table 1, the content of $Li_2O$ was more than 15 percent by weight. When the content of $Li_2O$ was excessively high, the chemical stability of glass was degraded, and as a result, the insulation reliability was degraded as described above.

Sample 5 had a low Qf. Sample 5 included Glass G5, and as shown in Table 1, the content of MgO was less than 20 percent by weight. Hence, a crystalline phase, such as $Mg_3B_2O_6$, which gave a high Q value was not precipitated, and as a result, Qf was decreased.

Compared to the above Glass G5, the content of MgO in Glass G8 was more than 50 percent by weight as shown in

TABLE 2

| SAMPLE NO. | AMOUNT OF $CaZrO_3$ (PERCENT BY WEIGHT) | TYPE OF GLASS | AMOUNT OF GLASS (PERCENT BY WEIGHT) | $\epsilon_r$ | Qf (GHz) | TCC (ppm/° C.) | INSULATION RELIABILITY |
|---|---|---|---|---|---|---|---|
| 1* | 92.0 | G1 | 8.0 | | NOT-SINTERED | | |
| 2 | 92.0 | G2 | 8.0 | 24.3 | 22000 | 30 | ○ |
| 3 | 92.0 | G3 | 8.0 | 25.2 | 24000 | 25 | ○ |
| 4* | 92.0 | G4 | 8.0 | 26.0 | 28000 | 15 | X |
| 5* | 92.0 | G5 | 8.0 | 26.5 | 4800 | 40 | ○ |
| 6 | 92.0 | G6 | 8.0 | 25.5 | 10000 | 30 | ○ |
| 7 | 92.0 | G7 | 8.0 | 24.8 | 30000 | 12 | ○ |
| 8 | 92.0 | G10 | 8.0 | 25.8 | 21000 | 11 | ○ |
| 9 | 92.0 | G11 | 8.0 | 25.1 | 19000 | 15 | ○ |
| 10* | 92.0 | G12 | 8.0 | 27.1 | 28000 | 5 | X |
| 11 | 92.0 | G14 | 8.0 | 26.8 | 27000 | 7 | ○ |
| 12 | 92.0 | G15 | 8.0 | 24.5 | 22000 | 15 | ○ |
| 13* | 92.0 | G16 | 8.0 | | NOT-SINTERED | | |
| 14* | 92.0 | G17 | 8.0 | 25.3 | 25000 | 17 | X |
| 15 | 92.0 | G18 | 8.0 | 25.4 | 31000 | 5 | ○ |
| 16 | 92.0 | G19 | 8.0 | 26.2 | 29000 | 10 | ○ |
| 17* | 92.0 | G20 | 8.0 | 26.3 | 28000 | 9 | X |
| 18* | 92.0 | G21 | 8.0 | | NOT-SINTERED | | |
| 19 | 92.0 | G22 | 8.0 | 24.2 | 19000 | 18 | ○ |
| 20* | 92.0 | G23 | 8.0 | 26.5 | 1800 | 12 | ○ |
| 21 | 92.0 | G24 | 8.0 | 25.0 | 10000 | 8 | ○ |
| 22 | 92.0 | G25 | 8.0 | 24.9 | 19000 | 6 | ○ |
| 23* | 92.0 | G26 | 8.0 | 25.6 | 15000 | 2 | X |
| 24 | 92.0 | G27 | 8.0 | 25.5 | 18000 | 5 | ○ |
| 25* | 92.0 | G28 | 8.0 | 25.9 | 5000 | 8 | ○ |
| 26 | 92.0 | G29 | 8.0 | 25.5 | 12000 | 9 | ○ |
| 27 | 92.0 | G30 | 8.0 | 25.1 | 26000 | 6 | ○ |
| 28* | 99.5 | G15 | 0.5 | | NOT-SINTERED | | |
| 29 | 99.0 | G15 | 1.0 | 27.5 | 35000 | 0 | ○ |
| 30 | 98.0 | G15 | 2.0 | 27.0 | 34000 | 4 | ○ |
| 31 | 88.0 | G15 | 12.0 | 18.0 | 22000 | 50 | ○ |
| 32* | 85.0 | G15 | 15.0 | 15.2 | 9700 | 6 | ○ |

In Table 2, Sample Nos. provided with * are out of the range of the present invention.

Among the compositions shown in Table 2, $CaZrO_3$ functions to improve the relative dielectric constant ($\epsilon_r$). The glass functions to realize low-temperature sintering at 1,050° C. or less and also functions to increase the Q value by precipitation of the specific crystalline phase described above.

Since the amount of $CaZrO_3$ in Sample 32 was low, such as 85 percent by weight, which was less than 88 percent by weight, and the amount of glass was high, such as 15.0 percent by weight, which was more than 12 percent by weight, $\epsilon_r$ was relatively low, and Qf was also less than 10,000 GHz. For Sample 28, since the amount of glass was low, such as 0.5 percent by weight, which was less than 1 percent by weight, sintering could not be performed at a firing temperature of 980° C.

Next, the glass composition will be discussed.

Sample 1 was not sintered. Sample 1 included Glass G1, and as shown in Table 1, the content of $Li_2O$ in Glass G1 was less than 3.5 percent by weight. Although $Li_2O$ functioned to decrease the softening point of the glass, the reason sintering was not performed was that the content of $Li_2O$ was excessively low.

Table 1. When the ratio of an alkali metal or an alkaline earth metal was increased as described above, crystallization was liable to occur, and hence, as shown in Table 1, "devitrification" occurred.

Sample 20 had a low Qf. Sample 20 included Glass G23, and as shown in Table 1, the content of BaO was more than 25 percent by weight. The reason Qf was decreased was that an alkali metal or an alkaline earth metal, which was not crystallized, decreased the Q value of the glass (or more strictly speaking, a Q value of a crystalline phase after firing).

Sample 23 had inferior insulation reliability. Sample 23 included Glass G26, and as shown in Table 1, the content of CaO was more than 10 percent by weight. The reason the insulation reliability was degraded was that since the content of CaO was excessively high, the chemical stability of glass was degraded.

Sample 25 had a low Qf. Sample 25 included Glass G28, and as shown in Table 1, the content of SrO was more than 25 percent by weight. The reason Qf was decreased was that an alkali metal or an alkaline earth metal, which was not crystallized, decreased the Q value of the glass (Q value of the crystalline phase after firing).

Sample 10 had inferior insulation reliability. Sample 10 included Glass G12, and as shown in Table 1, in the content of $B_2O_3$ was more than 29 percent by weight. The reason the insulation reliability was degraded was that the content of $B_2O_3$ which degraded humidity resistance was excessively high.

Compared to the above Glass G12, the content of $B_2O_3$ in Glass G9, was less than 16 percent by weight as shown in Table 1. When the content of a glass network forming oxide, such as $B_2O_3$, was excessively low, it became difficult to perform vitrification, and hence, "devitrification" occurred as shown in Table 1.

Sample 13 was not sintered. Sample 13 included Glass G16, and as shown in Table 1, the content of $SiO_2$ was more than 35 percent by weight. The reason sintering was not performed was that since the content of $SiO_2$ was excessively high, the glass softening point was increased.

Compared to the above Glass G16, the content of $SiO_2$ in Glass G13 was less than 11 percent by weight as shown in Table 1. When the content of a glass network forming oxide, such as $SiO_2$, was low, it became difficult to perform vitrification, and hence, "devitrification" occurred as shown in Table 1.

Sample 14 had inferior insulation reliability. Sample 14 included Glass G17, and as shown in Table 1, the content of ZnO was less than 5 percent by weight. The reason the insulation reliability was degraded was that Glass G17 in which the content of ZnO was excessively low was used; however, detailed reasons are not understood.

Sample 17 had inferior insulation reliability. Sample 17 included Glass G20, and as shown in Table 1, the content of ZnO was more than 20 percent by weight. The reason the insulation reliability was degraded was that since the content of ZnO was excessively high, the humidity resistance of the glass was degraded.

Sample 18 was not sintered. Sample 18 included Glass G21, and as shown in Table 1, the content of $Al_2O_3$ was more than 15 percent by weight. When the content of $Al_2O_3$ was high, the firing temperature tended to increase; however, the reason sintering was not performed was that the content of $Al_2O_3$ was excessively high.

Compared to the samples described above, an $\in_r$ of 18.0 or more, a Qf of 10,000 GHz or more, an absolute TTC value of 50 ppm/° C. or less could be obtained in Samples 2, 3, 6 to 9, 11, 12, 15, 16, 19, 21, 22, 24, 26, 27, and 29 to 31, and in addition, the insulation reliability was superior.

EXPERIMENTAL EXAMPLE 2

In Experimental Example 2, it was attempted to obtain a sintered body in such a way that a disc-shaped molded body was obtained by a process similar to that in Experimental Example 1 but using $Al_2O_3$ or $MgAl_2O_4$ instead of $CaZrO_3$, followed by performing a debinding step and a firing step.

More particularly, in order to obtain a sintered body in Comparative Example 1, Glass G15 was used as the glass, the amount thereof was set to 8 percent by weight, $Al_2O_3$ was used as the ceramic, and the amount thereof was set to 92 percent by weight; however, sintering could not be preformed.

In Comparative Example 2, Glass G15 was used as the glass, the amount thereof was set to 20 percent by weight, $Al_2O_3$ was used as the ceramic, and the amount thereof was set to 80 percent by weight; however, sintering could not be preformed. In Comparative Example 2, it was noticeable that although the amount of glass was high, such as 20 percent by weight, sintering could not be performed.

In Comparative Example 3, Glass G15 was used as the glass, the amount thereof was set to 8 percent by weight, $MgAl_2O_4$ was used as the ceramic, and the amount thereof was set to 92 percent by weight; however, sintering could not be preformed.

In Comparative Example 4, Glass G15 was used as the glass, the amount thereof was set to 20 percent by weight, $MgAl_2O_4$ was used as the ceramic, and the amount thereof was set to 80 percent by weight; however, sintering could not be preformed. In Comparative Example 4, it was noticeable that although the amount of glass was high, such as 20 percent by weight, sintering could not be performed.

EXPERIMENTAL EXAMPLE 3

In Experimental Example 3, experiments were performed to confirm the individual effects of $BaZrO_3$, $SrTiO_3$, and $Mg_2SiO_4$, which were further included in the glass ceramic composition of the present invention.

In addition to the $CaZrO_3$ powder, a $BaZrO_3$ powder, a $SrTiO_3$ powder, and an $Mg_2SiO_4$ powder were prepared. Next, after the $CaZrO_3$ powder, the $BaZrO_3$ powder, the $SrTiO_3$ powder, and the $Mg_2SiO_4$ powder were mixed together with one of Glass powders G1 to G7, G10 to G12, and G14 to G30 to obtain the composition ratios shown in Tables 3 and 4, appropriate amounts of vinyl acetate and purified water were added to this mixed powder and were then wet-mixed, followed by performing pelletizing, so that powders of Samples 101 to 144 were obtained.

In each of Samples 101 to 127 and 129 to 133 shown in Tables 3 and 4, the type of glass and the amount thereof are the same as those of Samples 1 to 32 shown in Table 2 except that $CaZrO_3$ was partly replaced with $BaZrO_3$ and $SrTiO_3$.

In addition, Samples 3, 11, and 21 shown in Table 2 are again shown in Table 4. The reason for this is to compare "the rate of change in capacitance", which was not evaluated in Experimental Example 1, to that of the other samples.

Subsequently, sintered bodies of Samples 101 to 144 were obtained by a procedure equivalent to that of Experimental Example 1. In addition, by methods similar to those of Experimental Example 1, the relative dielectric constant $\in_r$, the Q value, the temperature coefficient of dielectric constant (TCC), and the insulation reliability of each sintered body evaluation results are shown in Tables 3 and 4.

In Experimental Example 3, the rate of change in capacitance of each of Samples 101 to 144 and Samples 3, 11, and 21 obtained in Experimental Example 1 was further evaluated. For the rate of change in capacitance, an acceleration test at a temperature of 150° C. with a DC voltage application of 200 V was performed for 100 hours on a multilayer capacitor which was formed to evaluate the insulation reliability, and when the capacitance before the test was represented by $C_0$ and the capacitance after the test was represented by $C_1$, the rate of change in capacitance was obtained from the following formula:

$$\text{Rate of Change in Capacitance } [\%] = \{(C_1 - C_o)/C_o\} \times 100.$$

TABLE 3

| SAMPLE NO. | AMOUNT OF CaZrO3 (PERCENT BY WEIGHT) | AMOUNT OF BaZrO3 (PERCENT BY WEIGHT) | AMOUNT OF SrTiO3 (PERCENT BY WEIGHT) | AMOUNT OF Mg2SiO4 (PERCENT BY WEIGHT) | TYPE OF GLASS | AMOUNT OF GLASS (PERCENT BY WEIGHT) | $\epsilon r$ | Qf (GHz) | TCC (ppm/°C.−1) | INSULATION RELIABILITY | RATE OF CHANGE IN CAPACITANCE (%) |
|---|---|---|---|---|---|---|---|---|---|---|---|
| 101* | 47.0 | 44.0 | 1.0 | — | G1 | 8.0 | | | NOT-SINTERED | | |
| 102 | 47.0 | 44.0 | 1.0 | — | G2 | 8.0 | 27.2 | 24000 | 15 | ○ | 0.18 |
| 103 | 67.0 | 24.0 | 1.0 | — | G3 | 8.0 | 28.3 | 23000 | 12 | ○ | 0.09 |
| 104* | 32.0 | 59.0 | 1.0 | — | G4 | 8.0 | 29.1 | 26000 | −22 | X | — |
| 105* | 72.0 | 19.0 | 1.0 | — | G5 | 8.0 | 25.9 | 4000 | 31 | ○ | 0.08 |
| 106 | 90.0 | 1.0 | 1.0 | — | G6 | 8.0 | 31.8 | 13000 | 36 | ○ | 0.07 |
| 107 | 52.0 | 39.0 | 1.0 | — | G7 | 8.0 | 26.6 | 28000 | 31 | ○ | 0.14 |
| 108 | 61.0 | 30.0 | 1.0 | — | G10 | 8.0 | 28.3 | 21000 | 26 | ○ | 0.03 |
| 109 | 7.0 | 84.0 | 1.0 | — | G11 | 8.0 | 20.4 | 17000 | −42 | ○ | 0.16 |
| 110* | 67.0 | 24.0 | 1.0 | — | G12 | 8.0 | 28.1 | 25000 | 16 | X | — |
| 111 | 62.0 | 29.0 | 1.0 | — | G14 | 8.0 | 27.0 | 26000 | 12 | ○ | 0.08 |
| 112 | 62.0 | 29.0 | 1.0 | — | G15 | 8.0 | 26.8 | 24000 | 6 | ○ | 0.07 |
| 113* | 17.0 | 74.0 | 1.0 | — | G16 | 8.0 | | | NOT-SINTERED | | |
| 114* | 89.0 | 2.0 | 1.0 | — | G17 | 8.0 | 26.7 | 26000 | 37 | X | — |
| 115 | 46.0 | 45.0 | 1.0 | — | G18 | 8.0 | 28.8 | 25000 | 24 | ○ | 0.16 |
| 116 | 51.0 | 40.0 | 1.0 | — | G19 | 8.0 | 28.8 | 28000 | 11 | ○ | 0.17 |
| 117* | 32.0 | 59.0 | 1.0 | — | G20 | 8.0 | 30.4 | 30000 | 17 | X | — |
| 118* | 61.0 | 30.0 | 1.0 | — | G21 | 8.0 | | | NOT-SINTERED | | |
| 119 | 22.0 | 69.0 | 1.0 | — | G22 | 8.0 | 26.1 | 24000 | −18 | ○ | 0.18 |
| 120* | 72.0 | 19.0 | 1.0 | — | G23 | 8.0 | 28.0 | 3000 | 22 | ○ | 0.05 |
| 121 | 32.0 | 59.0 | 1.0 | — | G24 | 8.0 | 26.4 | 12000 | 16 | ○ | 0.14 |
| 122 | 62.0 | 29.0 | 1.0 | — | G25 | 8.0 | 28.9 | 20000 | 6 | ○ | 0.03 |
| 123* | 56.0 | 35.0 | 1.0 | — | G26 | 8.0 | 28.6 | 12000 | 16 | X | — |
| 124 | 42.0 | 49.0 | 1.0 | — | G27 | 8.0 | 28.5 | 10000 | 21 | ○ | 0.15 |

TABLE 4

| SAMPLE NO. | AMOUNT OF CaZrO3 (PERCENT BY WEIGHT) | AMOUNT OF BaZrO3 (PERCENT BY WEIGHT) | AMOUNT OF SrTiO3 (PERCENT BY WEIGHT) | AMOUNT OF Mg2SiO4 (PERCENT BY WEIGHT) | TYPE OF GLASS | AMOUNT OF GLASS (PERCENT BY WEIGHT) | $\epsilon r$ | Qf (GHz) | TCC (ppm/°C.−1) | INSULATION RELIABILITY | RATE OF CHANGE IN CAPACITANCE (%) |
|---|---|---|---|---|---|---|---|---|---|---|---|
| 125* | 36.0 | 55.0 | 1.0 | — | G28 | 8.0 | 29.4 | 3000 | 12 | ○ | 0.17 |
| 126 | 12.0 | 79.0 | 1.0 | — | G29 | 8.0 | 24.3 | 10000 | 16 | ○ | 0.16 |
| 127 | 71.0 | 20.0 | 1.0 | — | G30 | 8.0 | 25.0 | 24000 | 22 | ○ | 0.05 |
| 128 | 5.0 | 86.0 | 1.0 | — | G11 | 8.0 | 23.3 | 7000 | −85 | ○ | 0.18 |
| 129* | 18.5 | 80.0 | 1.0 | — | G15 | 0.5 | | | NOT-SINTERED | | |
| 130 | 22.0 | 76.0 | 1.0 | — | G15 | 1.0 | 25.5 | 30000 | −30 | ○ | 0.18 |
| 131 | 82.0 | 15.0 | 1.0 | — | G15 | 2.0 | 29.1 | 32000 | 26 | ○ | 0.09 |
| 132 | 22.0 | 65.0 | 1.0 | — | G15 | 12.0 | 26.0 | 21000 | −34 | ○ | 0.15 |
| 133* | 2.0 | 82.0 | 1.0 | — | G15 | 15.0 | 20.3 | 5000 | 20 | ○ | 0.13 |
| 134* | 85.0 | 5.0 | 8.0 | — | G15 | 2.0 | 33.1 | 27000 | −280 | ○ | 0.02 |
| 135 | 87.0 | 5.0 | 6.0 | — | G15 | 2.0 | 31.4 | 30000 | −115 | ○ | 0.09 |
| 136 | 92.0 | 5.0 | 1.0 | — | G15 | 2.0 | 28.7 | 33000 | 43 | ○ | 0.08 |
| 137 | 93.0 | 5.0 | 0.0 | — | G15 | 2.0 | 26.3 | 34000 | 63 | ○ | 0.07 |
| 138 | 25.0 | 66.0 | 1.0 | 5.0 | G15 | 3.0 | 24.1 | 33000 | 21 | ○ | 0.18 |
| 139 | 20.0 | 36.0 | 1.0 | 40.0 | G15 | 3.0 | 21.9 | 41000 | 52 | ○ | 0.18 |
| 140 | 20.0 | 31.0 | 1.0 | 45.0 | G15 | 3.0 | 19.2 | 44000 | 76 | ○ | 0.19 |
| 141 | 87.0 | 0.0 | 0.0 | 5.0 | G3 | 8.0 | 24.1 | 27000 | 31 | ○ | 0.37 |
| 142 | 52.0 | 0.0 | 0.0 | 40.0 | G3 | 8.0 | 21.2 | 29000 | 53 | ○ | 0.42 |
| 143 | 47.0 | 0.0 | 0.0 | 45.0 | G3 | 8.0 | 18.6 | 33000 | 81 | ○ | 0.43 |
| 144 | 47.0 | 5.0 | 0.0 | 40.0 | G3 | 8.0 | 22.6 | 28000 | 43 | ○ | 0.06 |
| 3 | 92.0 | 0.0 | 0.0 | — | G3 | 8.0 | 25.2 | 24000 | 25 | ○ | 0.41 |
| 11 | 92.0 | 0.0 | 0.0 | — | G14 | 8.0 | 26.8 | 27000 | 7 | ○ | 0.43 |
| 21 | 92.0 | 0.0 | 0.0 | — | G24 | 8.0 | 25.0 | 10000 | 8 | ○ | 0.48 |

In Tables 3 and 4, Sample Nos. provided with * are out of the range of the present invention.

Since the same types of glass and the same amounts thereof as those of Samples 1 to 32 shown in Table 2 except that $CaZrO_3$ was partly replaced with $BaZrO_3$ and $SrTiO_3$, Samples 101 to 127 and 129 to 133 shown in Tables 3 and 4 correspond to respective Samples 1 to 32. Hence, Samples 101 to 127 and 129 to 133 had tendencies very similar to those of respective Samples 1 to 32.

For Sample 133 corresponding to Sample 32, since the amount of glass was high, such as 15.0 percent by weight, which was more than 12 percent by weight, $\epsilon_r$ was relatively low, and Qf was also low, such as 5,000 GHz. For Sample 129 corresponding to Sample 28, since the amount of glass was low, such as 0.5 percent by weight, which was less than 1 percent by weight, sintering could not be performed at a firing temperature of 980° C. described above.

Next, the composition of glass will be discussed.

Sample 101 corresponding to Sample 1 was not sintered. The reason for this was that Sample 101 included Glass G1 in which the content of $Li_2O$ was less than 3.5 percent by weight. Sample 104 corresponding to Sample 4 had inferior insulation reliability. The reason for this was that Sample included Glass G4 in which the content of $Li_2O$ was more than 15 percent by weight.

Sample 105 corresponding to Sample 5 had a low Qf of 4,000 GHz. The reason for this was that Sample 105 included Glass G5 in which the content of MgO was less than 20 percent by weight.

Sample 120 corresponding to Sample 20 had a low Qf of 3,000 GHz. The reason for this was that Sample 120 included Glass G23 in which the content of BaO was more than 25 percent by weight.

Sample 123 corresponding to Sample 23 had inferior insulation reliability. The reason for this was that Sample 123 included Glass G26 in which the content of CaO was more than 10 percent by weight.

Sample 125 corresponding to Sample 25 had a low Qf of 3,000 GHz. The reason for this was that Sample 25 included Glass G28 in which the content of SrO was more than 25 percent by weight.

Sample 110 corresponding to Sample 10 had inferior insulation reliability. The reason for this was that Sample included Glass G12 in which the content of $B_2O_3$ was more than 29 percent by weight.

Sample 113 corresponding to Sample 13 was not sintered. The reason for this was that Sample 113 included Glass G16 in which the content of $SiO_2$ was more than 35 percent by weight.

Sample 114 corresponding to Sample 14 had inferior insulation reliability. The reason for this was that Sample 114 included Glass G17 in which the content of ZnO was less than 5 percent by weight. Sample 117 corresponding to Sample 17 also had inferior insulation reliability. The reason for this was that Sample 117 included Glass G20 in which the content of ZnO was more than 20 percent by weight.

Sample 118 corresponding to Sample 18 was not sintered. The reason for this was that Sample 118 included Glass G21 in which the content of $Al_2O_3$ was more than 15 percent by weight.

Compared to the samples described above, Samples 102, 103, 106 to 109, 111, 112, 115, 116, 119, 121, 122, 124, 126, 127, and 130 to 132 among Samples 101 to 127 and 129 to 133 corresponding to respective Samples 1 to 32, had an $\epsilon_r$ of 20 or more, a Qf of 10,000 GHz or more, an absolute TTC value of 50 ppm/° C. or less, and in addition, the insulation reliability was superior.

As apparent when Samples 102, 103, 106 to 109, 111, 112, 115, 116, 119, 121, 122, 124, 126, 127, and 130 to 132, which were within the range of the present invention, are compared to Samples 3, 11, and 21, which included neither $BaZrO_3$ nor $SrTiO_3$, shown in Table 4, and more particularly, as apparent when Samples 103, 111, and 121, which corresponded to Samples 3, 11, and 21, respectively, are compared thereto, the rate of change in capacitance could be decreased when $BaZrO_3$ and $SrTiO_3$ were included.

In particular, the rate of change in capacitance could be further decreased in Samples 103, 108, 111, 112, 122, 127, and 131, each of which included 30 percent by weight or less of $BaZrO_3$.

It is understood from Sample 128 that the upper limit of the content of $BaZrO_3$ is preferably 84 percent by weight. In Sample 128 in which the content of $BaZrO_3$ was more than percent by weight, Qf was decreased to 7,000, and the absolute value of TCC exceeded 50 ppm/° C.

In Samples 134 to 137 shown in Table 4, the content of $SrTiO_3$ was varied. $SrTiO_3$ is a material having a high TCC at the negative side and a high Q value as well as a high dielectric constant. When Sample 137 which included no $SrTiO_3$ is compared to Samples 134 to 136 which included $SrTiO_3$, it is apparent that when $SrTiO_3$ is included, the relative dielectric constant $\epsilon_r$ can be improved without seriously decreasing Qf, and TCC can be varied to the negative side. However, when the content of $SrTiO_3$ is more than 6 percent by weight as in Sample 134, TCC is increased excessively to the negative side, and hence it is not preferable.

In Samples 138 to 144 shown in Table 4, $Mg_2SiO_4$ was included, and the content thereof was varied. Since $Mg_2SiO_4$ was included, the Qf could be further improved. However, in Samples 140 and 143 in which more than 40 percent by weight of $Mg_2SiO_4$ was included, the relative dielectric constant $\epsilon_r$ was decreased. Hence, 40 percent by weight or less of $Mg_2SiO_4$ is preferably included.

In Samples 141 to 143, neither $BaZrO_3$ nor $SrTiO_3$ were included. Hence, it is understood that the effect of including $Mg_2SiO_4$ can be obtained regardless whether $BaZrO_3$ and/or $SrTiO_3$ is included or not.

EXPERIMENTAL EXAMPLE 4

In Experimental Example 4, first glass ceramic layers having a relatively high dielectric constant, which were formed from first glass ceramic compositions obtained in Experimental Example 3, and second glass ceramic layers having a relatively low dielectric constant, which were obtained from a second glass ceramic composition formed as described below, were laminated together and were fired, so that a multilayer ceramic electronic component including the first and the second glass ceramic layers having different relative dielectric constants from each other was formed.

As the borosilicate glass powder included in the second glass ceramic composition, Glasses G3, G5, G10, G12, G31, G32, and G18 having compositions shown in Table 5 were prepared and were pulverized to have an average particle diameter of 1 to 2 μm. Glasses G3, G5, G10, G12, and G18 shown in Table 5 were the same as Glasses G3, G5, G10, G12, and G18 shown in Table 1, respectively.

TABLE 5

| GLASS MARK | Li$_2$O (PERCENT BY WEIGHT) | MgO (PERCENT BY WEIGHT) | BaO (PERCENT BY WEIGHT) | CaO (PERCENT BY WEIGHT) | SrO (PERCENT BY WEIGHT) | B$_2$O$_3$ (PERCENT BY WEIGHT) | SiO$_2$ (PERCENT BY WEIGHT) | ZnO (PERCENT BY WEIGHT) | Al$_2$O$_3$ (PERCENT BY WEIGHT) |
|---|---|---|---|---|---|---|---|---|---|
| G3   | 15 | 23 | 2 | —  | 7 | 20 | 23 | 10 | —  |
| G5*  | 6  | 18 | 5 | —  | 5 | 26 | 28 | 8  | 4  |
| G10  | 8  | 34 | 3 | 2  | 3 | 16 | 25 | 7  | 2  |
| G12* | 6  | 23 | 3 | 1  | 6 | 31 | 20 | 10 | —  |
| G31  | 5  | 33 | 5 | —  | 8 | 18 | 25 | 6  | —  |
| G32* | 6  | 23 | 4 | —  | — | 15 | 46 | 6  | —  |
| G18  | 6  | 25 | 3 | —  | 5 | 24 | 31 | 6  | —  |

In Table 5, "Glass Marks" provided with * are out of the range of the composition of "borosilicate glass" defined in claim 7.

In addition, as a first ceramic powder included in the second glass ceramic composition, an Mg$_2$SiO$_4$ powder having an average particle diameter (central particle diameter D50) of 0.8 μm was prepared, and as a second ceramic powder, a powder having an average particle diameter of 1.5 μm, a SrTiO$_3$ powder having an average particle diameter of 1.5 μm, and a TiO$_2$ powder having an average particle diameter of 1.0 μm were also prepared.

Next, in order to obtain the second glass ceramic composition of each sample shown in Table 6, the above first ceramic powder, borosilicate glass, and second ceramic powder were mixed together.

TABLE 6

| SAMPLE NO. | AMOUNT OF FIRST CERAMIC (PERCENT BY WEIGHT) | BOROSILICATE GLASS TYPE | AMOUNT (PERCENT BY WEIGHT) | SECOND CERAMIC TYPE | AMOUNT (PERCENT BY WEIGHT) | INSULATION RELIABILITY |
|---|---|---|---|---|---|---|
| 201  | 85.0 | G3  | 3.0  | CT   | 12.0    | ○ |
| 202* | 77.0 | G5  | 15.0 | ST   | 8.0     | ○ |
| 203  | 75.0 | G10 | 15.0 | ST   | 10.0    | ○ |
| 204* | 78.0 | G12 | 15.0 | CT   | 7.0     | X |
| 205* | 74.0 | G32 | 18.0 | CT   | 8.0     | NOT-SINTERED |
| 206  | 75.0 | G18 | 15.0 | CT   | 10.0    | ○ |
| 207  | 83.5 | G31 | 9.0  | ST/T | 6.5/1.0 | ○ |
| 208  | 80.5 | G31 | 9.0  | ST/T | 7.0/5.5 | ○ |

In Table 6, Sample Nos. provided with * are out of the range of "second glass ceramic composition" defined in claim 7.

The addition amount of an Mg$_2$SiO$_4$ powder functioning as the first ceramic powder is shown in the column "amount of first ceramic" shown in Table 6.

In the column "type" of "borosilicate glass", the "Glass Mark" in Table 5 is shown, and in the column "amount" of "borosilicate glass", the addition amount of the borosilicate glass powder is shown.

In the column "type" of "second ceramic", one of CaTiO$_3$ (=CT), SrTiO$_3$ (=ST), and TiO$_2$ (=T) used as the second ceramic powder is shown, and in the column "amount" of "second ceramic", the addition amount thereof is shown.

Next, the insulation reliability of the second glass ceramic composition of each sample shown in Table 6 was evaluated by a method similar to that of Experimental Example 1. The results are also shown in Table 6.

Sample 204 included Glass G12 as the borosilicate glass, and as shown in Table 5, Glass G12 included more than 30 percent by weight of B$_2$O$_3$. Hence, Sample 204 showed inferior insulation reliability as shown in Table 6.

Sample 205 included Glass G32 as the borosilicate glass, and as shown in Table 5, Glass G32 included more than 45 percent by weight of SiO$_2$. Hence, Sample 205 was not sintered at a temperature of 1,000° C. or less as shown in Table 6.

Next, as shown in the column "sample No. of first glass ceramic composition in Tables 3 and 4" of Table 7, a binder and an organic solvent were added to each of the first glass ceramic compositions of the respective Samples 102, 104, 106, 112, 116, 119, 120, 127, 138, and 141 shown in the above Tables 3 and 4 to form a slurry, and by using a doctor blade method for this slurry, first glass ceramic green sheets were formed.

In addition, as shown in the column "sample No. of second glass ceramic composition in Table 6" of Table 7, a binder and an organic solvent were added to each of the second glass ceramic compositions of the respective Samples 201 to 208 shown in Table 6 to form a slurry, and by using a doctor blade method for this slurry, second ceramic green sheets were formed.

Next, after printing of a conductive paste for forming internal electrodes was completed for each green sheet, steps were performed such that the first glass ceramic green sheets and the second glass ceramic green sheets were laminated in a predetermined order and were then pressure-bonded, and firing was performed to co-sinter the first glass ceramic composition and the second glass ceramic composition, so that a multilayer capacitor having a co-sintered body including the first glass ceramic layers and the second glass ceramic layers was obtained as a sample. In this multilayer capacitor used as the sample, measurement terminals (external electrodes) were provided for the first ceramic layer side and the second ceramic layer side for measuring the respective electrical properties thereof.

TABLE 7

| SAMPLE NO. | SAMPLE NO. OF FIRST GLASS CERAMIC COMPOSITION IN TABLES 3 AND 4 | SAMPLE NO. OF SECOND GLASS CERAMIC COMPOSITION IN TABLE 6 | PRESENCE OF CROSS-SECTIONAL DEFECTS OF CO-SINTERED BODY | INSULATION RELIABILITY FIRST CERAMIC LAYER SIDE | INSULATION RELIABILITY SECOND CERAMIC LAYER SIDE | RATE OF CHANGE IN CAPACITANCE (%) FIRST CERAMIC LAYER SIDE | RATE OF CHANGE IN CAPACITANCE (%) SECOND CERAMIC LAYER SIDE |
|---|---|---|---|---|---|---|---|
| 301 | 102 | 201 | NO | ○ | ○ | 0.11 | 0.28 |
| 302 | 104 | 201 | YES | X | X | — | — |
| 303 | 106 | 202 | YES | X | X | — | — |
| 304 | 112 | 203 | NO | ○ | ○ | 0.13 | 0.29 |
| 305 | 116 | 204 | YES | X | X | — | — |
| 306 | 119 | 205 | YES | X | X | — | — |
| 307 | 120 | 206 | YES | X | X | — | — |
| 308 | 127 | 206 | NO | ○ | ○ | 0.15 | 0.26 |
| 309 | 138 | 207 | NO | ○ | ○ | 0.08 | 0.21 |
| 310 | 141 | 208 | NO | ○ | ○ | 0.06 | 0.22 |

The cross-section of the co-sintered body of each sample was observed to evaluate the presence of defects (pores) on the cross-section; the insulation reliability at the first glass ceramic layer side and that at the second ceramic layer side were respectively evaluated by a method similar to that in Experimental Example 1; and in addition, the rate of change in capacitance was evaluated by a method similar to that in Experimental Example 3. In the evaluation of the rate of change in capacitance, samples having no defects on the cross-section of the co-sintered body were only evaluated. The results are shown in Table 7.

In all evaluations of the cross-sectional defects, the insulation reliability, and the rate of change in capacitance of Samples 301, 304, and 308 to 310, superior results were obtained. According to Samples 301, 304, and 308 to 310, Sample 102, 112, 127, 138, and 141 used, respectively, as the "first glass ceramic composition" and are within the range of the present invention, and Samples 201, 203, 206, 207, and 208 used as the "second glass ceramic composition."

On the other hand, Samples 302 and 307, which used Samples 104 and 120, respectively, therein as the "first glass ceramic composition" were out of the range of the present invention, and Samples 303, 305, and 306, used Samples 202, 204, and 205, respectively, therein as the "second glass ceramic composition"; hence, in both cases, cross-sectional defects were generated, and the insulation reliability was inferior.

Although Sample 120 used as the "first glass ceramic composition" itself had superior insulation reliability as shown in Table 3, the insulation reliability of Sample 307 in which Sample 120 and the "second glass ceramic composition" were compounded, was inferior. In addition, although Sample 202 used as the "second glass ceramic composition" itself had superior insulation reliability as shown in Table 6, Sample 303 in which Sample 202 and the "first glass ceramic composition" were compounded, had inferior insulation reliability. The reason for this is believed that when the content of the Li component and/or the B component is high in at least one of the "first glass ceramic composition" and the "second glass ceramic composition" or Al was included therein, since the mutual diffusion is liable to occur between the two materials in firing, and reaction occurs therebetween to generate pores, and as a result, the insulation reliability is degraded at the two material sides.

The invention claimed is:

1. A multilayer ceramic electronic component comprising at least one first glass ceramic layer which comprises a fired glass ceramic composition comprising a $CaZrO_3$-based ceramic and a $Li_2O$—$MgO$—$ZnO$—$B_2O_3$—$SiO_2$-based glass, wherein the $Li_2O$—$MgO$—$ZnO$—$B_2O_3$—$SiO_2$-based glass is 1 to 12 percent by weight of the total composition, and in the glass, the content of $Li_2O$ is 3.5 to 15 percent by weight, the content of MgO is 20 to 50 percent by weight, the content of BaO is 0 to 25 percent by weight, the content of CaO is 0 to 10 percent by weight, the content of SrO is 0 to 25 percent by weight, the content of $B_2O_3$ is 16 to 29 percent by weight, the content of $SiO_2$ is 11 to 35 percent by weight, the content of ZnO is 5 to 20 percent by weight, and the content of $Al_2O_3$ is 0 to 15 percent by weight, and
further comprising at least one second glass ceramic layer laminated together with the first glass ceramic layer, wherein the second glass ceramic layer is a fired second glass ceramic composition, and the second glass ceramic composition comprises:
a first ceramic powder primarily composed of forsterite;
a second ceramic powder composed of at least one member selected from the group consisting of a ceramic powder primarily composed of calcium titanate, a ceramic powder primarily composed of strontium titanate, and a ceramic powder primarily composed of titanium oxide; and
3 percent by weight or more of a borosilicate glass powder comprising 3 to 15 percent by weight of lithium in the form of $Li_2O$, 20 to 50 percent by weight of magnesium in the form of MgO, 15 to 30 percent by weight of boron in the form of $B_2O_3$, 10 to 45 percent by weight of silicon in the form of $SiO_2$, 6 to 20 percent by weight of zinc in the form of ZnO, 0 to 15 percent by weight of aluminum in the form of $Al_2O_3$, and at least one additive component selected from the group consisting of 2 to 15 percent by weight of calcium in the form of CaO, 2 to 15 percent by weight of barium in the form of BaO, and 2 to 15 percent by weight of strontium in the form of SrO.

2. The multilayer ceramic electronic component according to claim 1, wherein the first glass ceramic layer glass ceramic composition further comprising 1 to 84 percent by weight of a $BaZrO_3$-based ceramic, and 0 to 6 percent by weight of $SrTiO_3$.

3. The multilayer ceramic electronic component according to claim 2, wherein the first glass ceramic layer glass ceramic composition content of $BaZrO_3$-based ceramic is 1 to 30 percent by weight.

4. The multilayer ceramic electronic component according to claim 3, wherein the first glass ceramic layer glass ceramic composition further comprising 40 percent by weight or less of $Mg_2SiO_4$.

5. The multilayer ceramic electronic component according to claim 4, wherein the first glass ceramic layer glass ceramic composition content of the $CaZrO_3$-based ceramic is 7 to 86 percent by weight.

6. The multilayer ceramic electronic component according to claim 2, wherein the first glass ceramic layer glass ceramic composition further comprising 40 percent by weight or less of $Mg_2SiO_4$.

7. The multilayer ceramic electronic component according to claim 1, wherein the first glass ceramic layer glass ceramic composition further comprising 40 percent by weight or less of $Mg_2SiO_4$.

8. The multilayer ceramic electronic component according to claim 1, wherein the first glass ceramic layer glass ceramic composition content of the $CaZrO_3$-based ceramic is 7 to 86 percent by weight.

9. The multilayer ceramic electronic component according to claim 1, wherein the first glass ceramic layer has a relative dielectric constant of at least 15, and the second glass ceramic layer has a relative dielectric constant of 10 or less.

10. The multilayer ceramic electronic component according to claim 9, further comprising a conductive pattern on, inside or both on and at least one layer, and comprising gold, silver, or copper.

11. The multilayer ceramic electronic component according to claim 10, wherein the first glass ceramic composition comprises 1 to 84 percent by weight of a $BaZrO_3$-based ceramic, 0 to 6 percent by weight of $SrTiO_3$, and 40 percent by weight or less of $Mg_2SiO_4$, and the $CaZrO_3$-based ceramic is 7 to 86 percent by weight.

12. The multilayer ceramic electronic component according to claim 11, wherein the first glass ceramic composition comprises 12 to 82 percent by weight $CaZrO_3$-based ceramic, 5 to 30 percent by weight of a $BaZrO_3$-based ceramic, 0 to 1 percent by weight of $SrTiO_3$, and 40 percent by weight or less of $Mg_2SiO_4$, and the glass comprises is 4 to 10 percent by weight $Li_2O$, 23 to 38 percent by weight MgO, 1 to 16 percent by weight BaO, 0 to 5 percent by weight CaO, 0 to 12 percent by weight SrO, 17 to 26 percent by weight $B_2O_3$, 11 to 35 percent by weight $SiO_2$, 6 to 10 percent by weight ZnO, and 0 to 5 percent by weight $Al_2O_3$; and wherein the second glass ceramic composition comprises 15 to 85 percent by weight of first ceramic powder, 7.5 to 12.5 percent by weight of second ceramic powder, and a glass which comprises is 6 to 8 percent by weight $Li_2O$, 23 to 38 percent by weight MgO, 2 to 5 percent by weight BaO, 0 to 2 percent by weight CaO, 5 to 8 percent by weight SrO, 16 to 24 percent by weight $B_2O_3$, 25 to 31 percent by weight $SiO_2$, 6 to 10 percent by weight ZnO, and 0 to 4 percent by weight $Al_2O_3$.

13. The multilayer ceramic electronic component according to claim 1, further comprising a conductive pattern on, inside or both on and at least one layer, and comprising gold, silver, or copper.

14. The multilayer ceramic electronic component according to claim 1, wherein the first glass ceramic composition comprises 1 to 84 percent by weight of a $BaZrO_3$-based ceramic, 0 to 6 percent by weight of $SrTiO_3$, and 40 percent by weight or less of $Mg_2SiO_4$, and the $CaZrO_3$-based ceramic is 7 to 86 percent by weight.

15. The multilayer ceramic electronic component according to claim 14, wherein the first glass ceramic composition comprises 12 to 82 percent by weight $CaZrO_3$-based ceramic, 5 to 30 percent by weight of a $BaZrO_3$-based ceramic, 0 to 1 percent by weight of $SrTiO_3$, and 40 percent by weight or less of $Mg_2SiO_4$, and the glass comprises is 4 to 10 percent by weight $Li_2O$, 23 to 38 percent by weight MgO, 1 to 16 percent by weight BaO, 0 to 5 percent by weight CaO, 0 to 12 percent by weight SrO, 17 to 26 percent by weight $B_2O_3$, 11 to 35 percent by weight $SiO_2$, 6 to 10 percent by weight ZnO, and 0 to 5 percent by weight $Al_2O_3$.

16. The multilayer ceramic electronic component according to claim 14, further comprising a conductive pattern on, inside or both on and at least one layer, and comprising gold, silver, or copper.

17. The multilayer ceramic electronic component according to claim 12, further comprising a conductive pattern on, inside or both on and at least one layer, and comprising gold, silver, or copper.

* * * * *